US006429798B1

(12) United States Patent
Dent

(10) Patent No.: US 6,429,798 B1
(45) Date of Patent: Aug. 6, 2002

(54) COMBINED TRANSMIT FILTER AND D-TO-A CONVERTER

(75) Inventor: Paul W. Dent, Pittsboro, NC (US)

(73) Assignee: Ericsson Inc., Research Triangle Park, NC (US)

(*) Notice: Subject to any disclaimer, the term of this patent is extended or adjusted under 35 U.S.C. 154(b) by 0 days.

(21) Appl. No.: 09/499,992

(22) Filed: Feb. 8, 2000

(51) Int. Cl.[7] .............................................. H03M 1/66
(52) U.S. Cl. ........................ 341/144; 341/154; 340/347
(58) Field of Search ................................ 341/144, 143, 341/145, 154, 153, 119, 118, 120, 121, 122; 340/347

(56) References Cited

U.S. PATENT DOCUMENTS

| | | | | |
|---|---|---|---|---|
| 3,581,304 A | * | 5/1971 | Paradise et al. ............ 340/347 |
| 3,670,151 A | * | 6/1972 | Lindsay et al. ............. 235/181 |
| 4,318,085 A | * | 3/1982 | Whiteside et al. .......... 340/347 |
| 4,382,285 A | | 5/1983 | Sumner et al. |
| 4,459,580 A | * | 7/1984 | Furukawa ................... 340/347 |
| 4,462,106 A | * | 7/1984 | De Freitas et al. ........... 375/30 |
| 4,661,948 A | | 4/1987 | Shapiro et al. |
| 4,665,382 A | * | 5/1987 | Morgan ............... 340/347 AD |
| 4,800,365 A | * | 1/1989 | White et al. ................. 341/119 |
| 5,699,064 A | * | 12/1997 | Sakiyama et al. .......... 341/154 |
| 5,867,537 A | | 2/1999 | Dent |
| 5,969,658 A | | 10/1999 | Nayler ....................... 341/154 |
| 6,181,269 B1 | * | 1/2001 | Nishiuchi et al. ........... 341/164 |

FOREIGN PATENT DOCUMENTS

| | | |
|---|---|---|
| EP | 0 642 221 A1 | 3/1995 |
| JP | 60081913 | 10/1985 |
| JP | 11004140 | 6/1999 |

OTHER PUBLICATIONS

Miyata, Takeo; Tamagawa, Katsuyoshi; and Watahiki, Takeshi; "Ternary–to–Analog Converters Using Resisto–Ladders"; The Transactions of the IECE of Japan, vol. E. 62, No. 9, Sep. 1979, pp. 628–629.

* cited by examiner

Primary Examiner—Brian Young
Assistant Examiner—John B. Nguyen
(74) Attorney, Agent, or Firm—Coats & Bennett, P.L.L.C.

(57) ABSTRACT

A combined filter and digital-to-analog converter (DAC) provides an integrated apparatus for converting a digital data stream into a filtered analog signal. The combined filter/DAC implements an N-tap digital filter using a serial shift register whose register output taps interconnect with a resistive ladder network. Each input to the resistive ladder has a specific signal attenuation (weighting factor) with respect to a ladder output node. Each ladder input's weighting factor corresponds to one of the digital filter tap coefficients. Shift register output taps interconnect with ladder network inputs in an arrangement that matches each output tap to its required weighting factor. With the resistive ladder, very small weighting factors can be realized without using large-value individual resistors that are problematic in high-bandwidth circuits. The filtered analog signal is taken from the ladder's output node and represents the weighted summation of tap outputs. By dividing the data bits input to the shift register into M phases, the N-tap filter/DAC may be realized in an N/M (L) length shift register. Each of the L taps is associated with a different group of M resistors. For each of the M phases, the L taps connect to a different one of the M resistors. Thus, only N/M resistors are driven at any one time, thereby reducing power consumption. This switching scheme may be combined with the ladder network arrangement above to reduce power and avoid the use of large-valued resistors.

79 Claims, 8 Drawing Sheets

COMBINED TRANSMIT FILTER AND D-TO-A CONVERTER

FIELD OF THE INVENTION

The present invention relates generally digital-to-analog (D-to-A) conversion and signal filtering, and more particularly to a combined D-to-A converter and transmit filter for a digital radio communication device.

BACKGROUND OF THE INVENTION

Modern mobile communication devices often use digital modulation techniques. Digital modulation offers many advantages over analog modulation, such as greater noise immunity and greater robustness to the adverse conditions of the communication channel. Digital modulation accommodates digital error detection and correction codes that can detect and correct errors that occur in transmission. Digital modulation also allows use of various digital signal-processing techniques, such as source coding, encryption, and equalization that improves the overall performance of the communication system.

In a digital communication system, the modulating signal (i.e. the information transmitted) is represented as a time sequence of symbols or pulses. Each symbol has one of afinite number of states. There are $2^n$ possible states where n is equal to the number of bits per symbol. The modulating signal is impressed onto a carrier waveform by varying a characteristic of the waveform. For example, in amplitude modulation, the amplitude of the carrier waveform is varied linearly with the modulating signal. In phase modulation, the phase of the waveform is varied linearly with the modulating signal. In complex modulation, also known as quadrature modulation, variations in both the amplitude and phase of the carrier waveform occur and thus create a time-varying signal vector in the two-dimensional complex plane.

FIG. 1 is a block diagram of a balanced quadrature modulator of the prior art, which is indicated generally by the numeral 10. A digital signal processor (DSP) 12 generates symbol sequences corresponding to the I and Q components of a modulating signal. The symbol sequences correspond to the real and imaginary parts of a desired complex modulation. The real part is given by the desired amplitude times the cosine of the desired phase angle. The imaginary part is given by the amplitude times the sine of the desired phase angle. Digital-to-analog (D-to-A) converters 14 convert each symbol sequence into an analog waveform, referred to as I (In-phase) and Q (Quadrature) modulating waveforms. Filters 16 remove smooth step changes in the I and Q waveforms that result from sampling and quantization. Absent filtering, the step changes in the modulating waveforms could produce undesirable spectral components in the transmitted signal that would interfere with adjacent radio channels. Filters 16 are typically low-pass filters that pass desired components of the modulating signal while suppressing higher frequency components associated with step changes in the modulating waveform. After filtering, the I and Q modulating waveforms are passed to a quadrature modulator 18, which impresses the modulating waveforms onto a carrier waveform.

It is known in the prior art that filtering may be performed using Finite Impulse Response (FIR) filters, which perform a weighted sum over a sliding window of successive symbols. Recent innovations in FIR filters are disclosed in U.S. Pat. No. 5,867,537 to Dent, which is incorporated herein by reference. The '537 patent discloses a method of filtering a bit sequence using a shift register and resistor networks to implement the weighting coefficients of the transmit filter. Balanced I and Q signals are input to a shift register at the bit rate or a desired oversampling rate. The non-inverted and inverted outputs of each shift register stage are connected to identical first and second resistor networks. The first and second resistor networks comprise a plurality of resistors of different value representing the desired transmit filter weights. The non-inverted outputs of the shift register are used for positive weights and the inverted outputs are used for negative weights. A first group of the non-inverted and inverted outputs is connected to the first resistor network and a second complementary group of non-inverted and inverted outputs are connected to the second resistor network. Thus, the first and second resistor networks produce complementary I or Q outputs suitable for input to a balanced quadrature modulator.

One drawback to using resistive networks to perform filtering is that large resistor values are needed to implement small weighting factors. Therefore, there is a need for further improvements in FIR filters.

SUMMARY OF THE INVENTION

The present invention is a combined digital to analog converter and transmit filter for use in a quadrature modulator. According to the present invention, a transmit filter is constructed by using a combining network, such as a resistor network, connected to the taps of a shift register to provide desired tap weights. To avoid using excessively high resistor values to implement very small weights, a ladder network is used to attenuate the contribution from taps with small associated weight values. However, a ladder network may only provide a progressively increasing attenuation from one stage to the next. In order to facilitate the use of a ladder network therefore, the invention comprises, in a first aspect, sorting of the filter tap weights in order of absolute magnitude in order to determine a modified order in which the taps of the shift register must be connected to successive sections of the ladder network. In a second aspect of the invention, a filter that operates at an oversampling factor of L samples per bit period or chip period is constructed by first separating the N tap weights into L groups of N/L weights, each group corresponding to one of the L oversampling phases. A resistor network is then designed for each group of N/L taps, which are provided by a shift register of length N/L stages and clocked at the chip rate or bit rate. A higher frequency clock of L times the chip or bitrate controls progressive selection among the L resistor networks of the network that is to be connected to the shift register to provide the output for each of the L oversampling phases.

A third aspect of the invention comprises a combination of the first and second aspects described above. After separating the N tap weights into L groups of N/L weights, each group of L tap weights is sorted in order of absolute magnitude and a ladder network for each group provides progressive attenuation of the contribution from successive taps in the sorted order of each group. An array of switches is controlled by an oversampling clock of L times the chip rate or bit rate to determine which ladder network shall be driven by the shift register outputs to provide the filtered signal output for each phase.

According to a fourth aspect of the invention, when the ladder networks for two or more oversampling phases comprise the same resistor values and differ only in the order in which the taps are connected to successive ladder network sections, the filter may be simplified to a single copy of the ladder network combined with a selection switch to select the different order in which the shift register taps are connected to the ladder network for different sampling phases.

According to a fifth aspect of the invention, a balanced output from the filter may be provided for driving a balanced modulator by duplicating the resistor networks, connecting the duplicate networks to register outputs of the opposite polarity to those connected to the primary copies of the resistor networks.

DETAILED DESCRIPTION OF THE INVENTION

Figure 2:
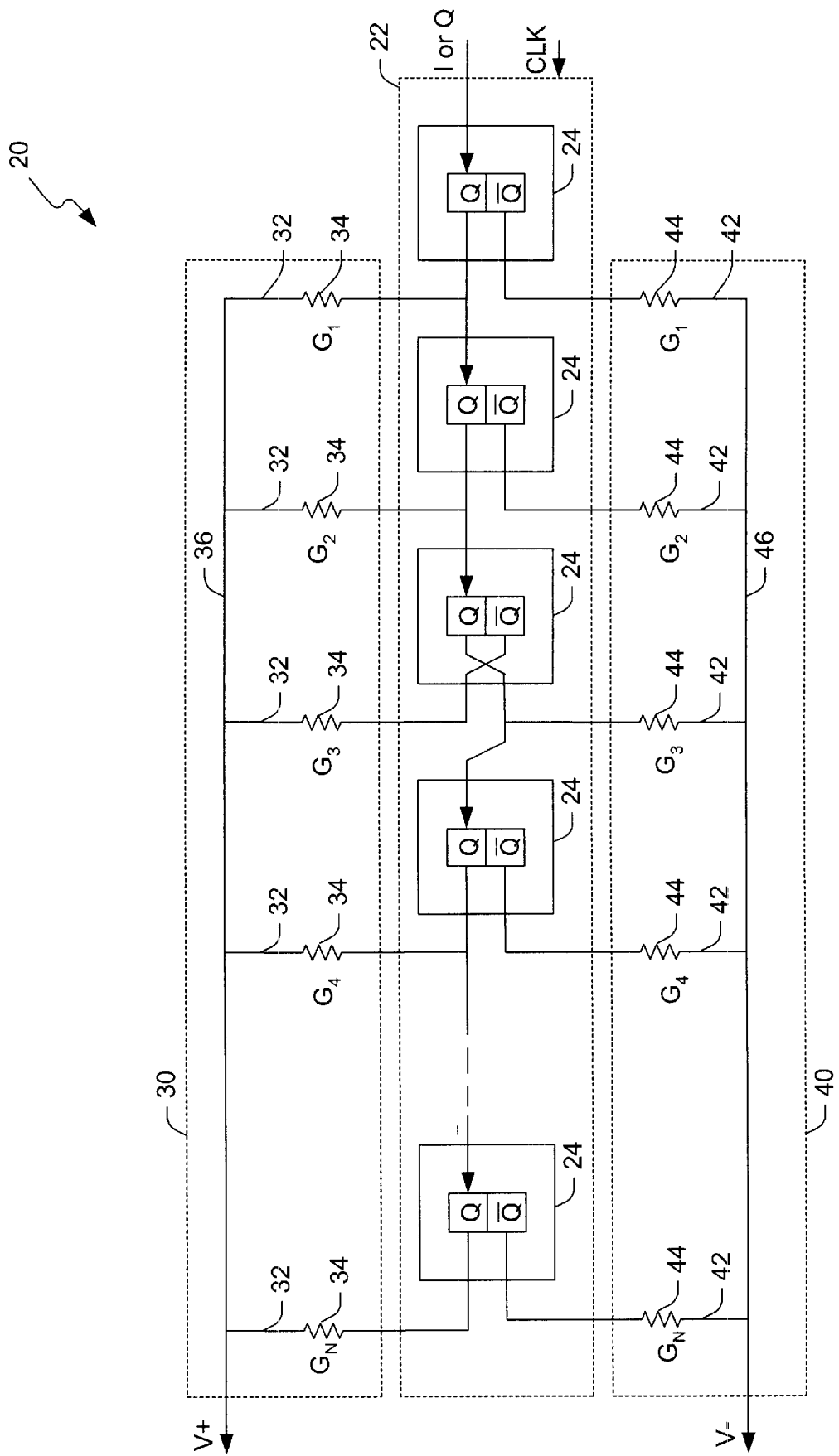
FIG. 2 is a schematic diagram of a converter/filter using a shift register and resistive networks to weight the outputs of the shift register.

FIG. 2 is a schematic diagram of a combined D-to-a converter and transmit filter 20 for a quadrature modulator according to U.S. Pat. No. 5,867,537 to Applicant. The converter/filter 20 implements an N tap finite impulse response filter using N tap weights. Separate filters are used for the I and Q channels. Only one filter 20 is shown in FIG. 2.

An I or Q bit stream enters a memory device having a plurality of memory elements for receiving and holding signal sample values. In the disclosed embodiments, the memory device comprises a shift register 22 having N shift register stages 24. Each shift register stage 24 comprises a flip-flop having complementary non-inverted Q and inverted outputs $\overline{Q}$. To implement oversampling, the spacing between outputs or taps may be less than the bit rate or chip rate. For example, the taps of the shift register stages 24 may be spaced one-fourth of the chip period to implement an oversampling factor of four.

The non-inverted and inverted outputs in each stage of the shift register 22 connect to first and second resistor networks 30, 40. The resistor networks 30, 40 comprise, in the disclosed embodiments of U.S. Pat. No. 5,867,537, a plurality of weighting resistors 34, 44 disposed in parallel branches 32, 42 of the resistor networks 30, 40. There is a one-to-one correspondence between branches 32, 42 in resistor networks 30, 40 and stages 24 in the shift register 22. The parallel branches 32, 42 are connected at one end to one of the inverted or non-inverted outputs of the shift register 22. The opposite end of each branch 32, 42 is connected to a summing node 36, 46. In a stage where a non-inverted output of the shift register 22 connects to a branch 32 the first resistor network 30, the non-inverted output connects to a corresponding branch 42 the second resistor network 40 and vice versa. Thus, the weighted outputs of summing nodes 36 and 46 will be balanced outputs suitable for input to a balanced modulator such as described in U.S. Pat. No. 5,530,722 to Applicant, which is incorporated herein by reference. The weighted outputs will swing in antiphase about a centerline of Vcc/2.

Figure 1:
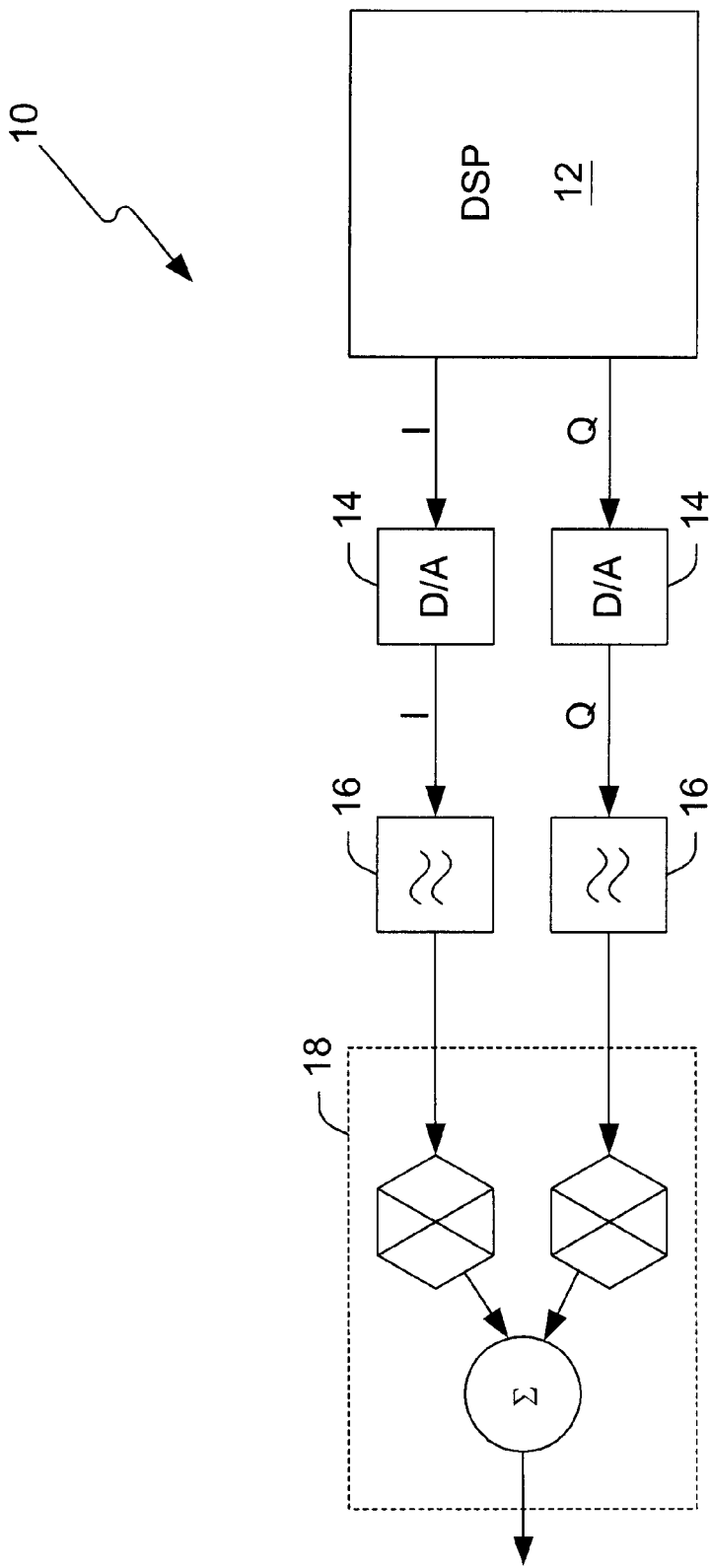
FIG. 1 is a schematic diagram of a conventional quadrature modulator.

The conductance values $G_1$ to $G_N$ of weighting resistors 34 and 44 are given by the desired filter impulse response, which is the inverse Fourier transform of the desired filter frequency response. When the ideal frequency response is finite, such as a root-raised cosine response in the frequency domain, the impulse response obtained by transforming from the frequency domain to the time domain will be infinite in extent. Thus, the impulse response should be truncated to a finite number of N stages so as to minimize spectral sidelobes caused by truncation, as is well-known in the art. In the above example using FIG. 1, the repetition of each chip four times also imposes an extra $\sin(x)/x$ factor in the frequency response which must be accounted for by first dividing the desired frequency response by the $\sin(x)/x$ factor. This is avoided in one embodiment of the invention discussed below.

When a weight value is negative, the corresponding weighting resistor 34, 44 connects to an inverted output of the shift register 22. Likewise, when weight value is positive, the corresponding weighting resistor 34, 44 connects to an uninverted output. If imaginary or complex values are needed, weighting resistors 34, 44 of the I filter connect to the Q shift register and vice-versa. Thus it is possible to implement any weight values, +ve, –ve, real, imaginary or complex.

For an I and a Q filter, both balanced, there are 2N resistors connected to non-inverted and inverted outputs which are instantaneously at an output voltage level corresponding to the 1-level of Vcc and the other 2N are connected to non-inverted and inverted outputs at the 0-level or ground voltage. The total resistance from Vcc to ground is thus given by two of the 2N sets of weighting resistors 34, 44 in series and the total current power consumption is Vcc divided by the net value of one set of N weighting resistors 34, 44 connected in parallel. To reduce the power consumption, high resistor values are therefore desirable. For example, assuming Vcc=3 volts and 3 mA is the target power consumption, the sum of G1+G2+G3 . . . $G_N$ should be 1 mhos or a resistance of 1 KOhms. For N=128 taps, the average resistance value is then 128 KOhms, which is a high value to fabricate on a chip using polysilicon or diffusion resistors. Long FETs, biased ON, are a known alternative way of making high-value resistors on a CMOS chip. However, all "on-chip" resistors have a wide absolute value spread, but fortunately it is only the relative values G1:G2:G3 . . . that determine the filter frequency response, and resistor ratios are held much more accurately on chip than are absolute values.

When the coefficient value spread is large, this will also result in the need for resistances that are much higher than the average value of 128 KOhms. A disadvantage of high-value resistors is that parasitic capacitances can become significant for filters of wide bandwidth. Therefore, there is an interest in finding ways to reduce resistor values without increasing power consumption, and also an interest in finding ways to implement small coefficients without excessive resistor values.

Figure 3:
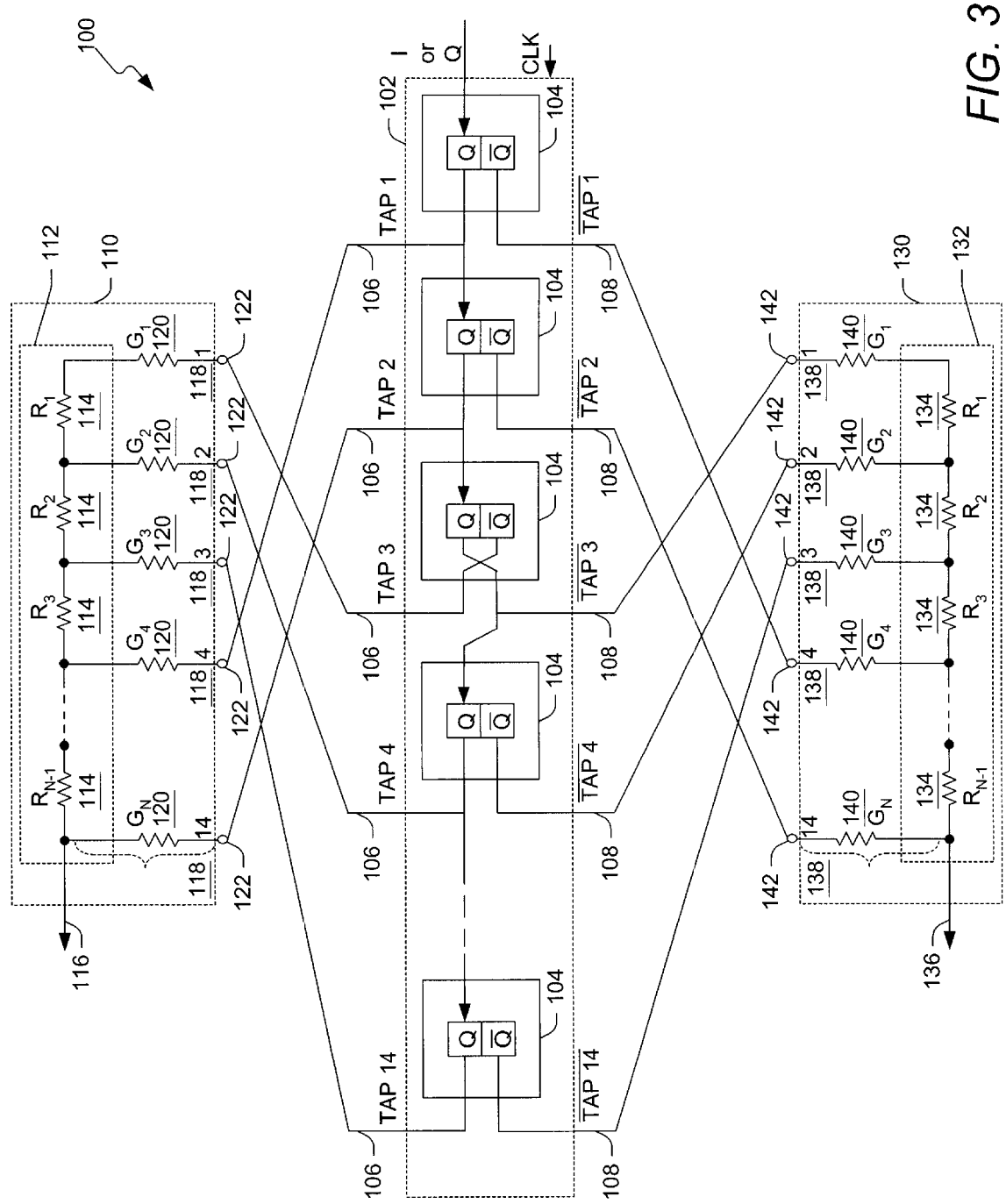
FIG. 3 is a schematic diagram of a converter/filter using a shift register and resistive ladder networks.

Referring now to FIG. 3, a combined N-tap filter/D-to-A converter of the present invention is shown therein and indicated generally by the numeral 100. In the example of FIG. 3, the converter/filter is depicted having 14 taps (N=14), but greater or fewer taps may be used depending upon the application. Separate converter/filters 100 are used for the I and Q channels. An I or Q bitstream enters a serial shift register 102 having 14 shift register stages 104. Each shift register stage 104 comprises a flip-flop and includes a positive logic output 106 (Q) and a negative logic output 108 ($\overline{Q}$). The Q/$\overline{Q}$ outputs from the shift register 102 are termed taps, with the $\overline{Q}$ taps 108 forming the logical complement to the Q taps 106. The input clock frequency relative to the incoming data chip rate (or bit rate) determines the tap spacing between the shift register stages 104. In this example, the CLK signal input to shift register 102 is four times the chip rate of the incoming I or Q channel data and, therefore, the tap spacing is one-fourth of the chip period and the filter/converter 100 operates with an oversampling factor of four. Thus, the input stream '1010' becomes '1111000011110000' with oversampling, which represents a square wave.

Resistive ladder networks 110 and 130 provide signal attenuation for each of the N-tap outputs 106 and 108 from shift register 102 in accordance with the weighting factors required for the N-tap filter, as determined from the N filter coefficients. Ladder network 110 comprises a set of branch inputs 122 all feeding into a ladder output connection 116, with each branch input 122 having potentially different weighting characteristics. Branch circuits 118 connect corresponding branch inputs 122 to a series resistive circuit 112 comprising a plurality of weighting resistors 114. Each branch circuit 118 connects the external signal received at the branch input 122 to a different node or stage in the series resistive circuit 112 through a weighting resistor 120. Resistive ladder networks 110, 130 provide increasing signal attenuation for external signals applied to branch inputs 122 successively further away from the ladder output connection 116. For example, assuming that all weighting resistors 120 in the branch circuits 118 are of equal value, a signal applied to the branch input 122 numbered "1" in FIG. 3 will have greater attenuation than a signal applied to the branch input 122 numbered "14." The extent to which the attenuation varies between any two given branches or stages depends upon the accumulated resistance between the two nodes in the resistive circuit 112 where the two given branch circuits 118 connect.

Ladder network 130 is similarly constructed having a series resistive circuit 132 with series weighting resistors 134, a set of branch inputs 142 providing connectivity between externally applied signals and the series resistive circuit 132 through branch circuits 138, each branch circuit 138 having a weighting resistor 140.

The N Q/$\overline{Q}$ output taps 106 and 108 from shift register 102 interconnect with the branch inputs 122 and 142 of ladder networks 110 and 130 in a pattern determined by the tap weighting (signal attenuation) required for any given shift register 102 output tap. Because of the progressive attenuation nature of the resistive ladder networks, tap outputs from shift register 102 that require the smallest weighting (greatest attenuation) are connected furthest from the ladder output connection points 116 and 136 for the ladder networks 110 and 130. According to the present invention, the filter tap coefficients or weighting factors implemented by the filter are sorted in ascending order of absolute value and a ladder network is constructed that implements the weighting factors in the sorted order. The register stages 104 of the shift register 102 connect to the branches 122, 132 of the ladder networks 110, 130 in order of absolute magnitude of the corresponding tap coefficient. That is, the shift register stage 104 with the smallest tap weight (i.e. the highest resistance) connects to the first branch input 122 and the shift register stage 104 with the largest tap weight (i.e. the smallest resistance) connects to the last branch input 122. In between, the shift register stages 104 connect to corresponding branch inputs 122 in ascending order of tap weights. The ladder networks 110, 130 provide decreasing resistance from the first stage to the last stage so that small weighting factors can be implemented without excessively large resistor values.

Further, to maintain a balanced output, if a Q output 106 from a given shift register stage 104 connects to the third branch input 122 of ladder network 110, then the $\overline{Q}$ output from that same given shift register stage 104 connects to the third branch input 142 of ladder network 130. Thus, the weighted outputs 116 and 136 of series circuits 112 and 132, respectively, will be balanced outputs suitable for input to a balanced modulator. The weighted outputs will swing in antiphase about a centerline of Vcc/2. Note that either resistive ladder 10 or 130 may interconnect with both Q and $\overline{Q}$ outputs from the shift register 102, with the specific interconnection determined by the sign and magnitude of the original N-tap filter coefficients.

As an example of ordering in accordance with tap weighting values, assume the following set of 14 tap weights:

| W1 | W2 | W3 | W4 | W5 | W6 | W7 | W8 | W9 | W10 | W11 | W12 | W13 | W14 |
|---|---|---|---|---|---|---|---|---|---|---|---|---|---|
| 0.01 | 0.03 | −0.08 | −0.15 | −0.1 | 0.3 | 0.5 | 0.5 | 0.3 | −0.1 | −0.15 | −0.08 | 0.03 | 0.01 |

In order of absolute magnitude, the tap weights are as follows:

| W1, W14 | W2, W13 | W3, W12 | W5, W10 | W4, W11 | W6, W9 | W7, W8 |
|---|---|---|---|---|---|---|
| 0.01 | 0.03 | 0.08 | 0.1 | 0.15 | 0.3 | 0.5 |

Like weights have been grouped together. Because of symmetry in this example, the right and left halves of the ladder network are identical and comprise conductances G1 to G7 and resistances R1 to R6 to be found in order to satisfy the requirement that the admittance matrix elements in the row corresponding to the output node shall be in proportion to the absolute magnitude of the desired weights W1 to W7 (W8 to W14). Since there are 13 degrees of freedom and only seven weights, the other six degrees of freedom (the 6 resistors R1 to R6) can be used to minimize some combination of power and chip area or to simplify the design. For example, all the values G1 to G7 could be made equal and the values R1 to R6 chosen to get the desired weight distribution.

Figure 4:
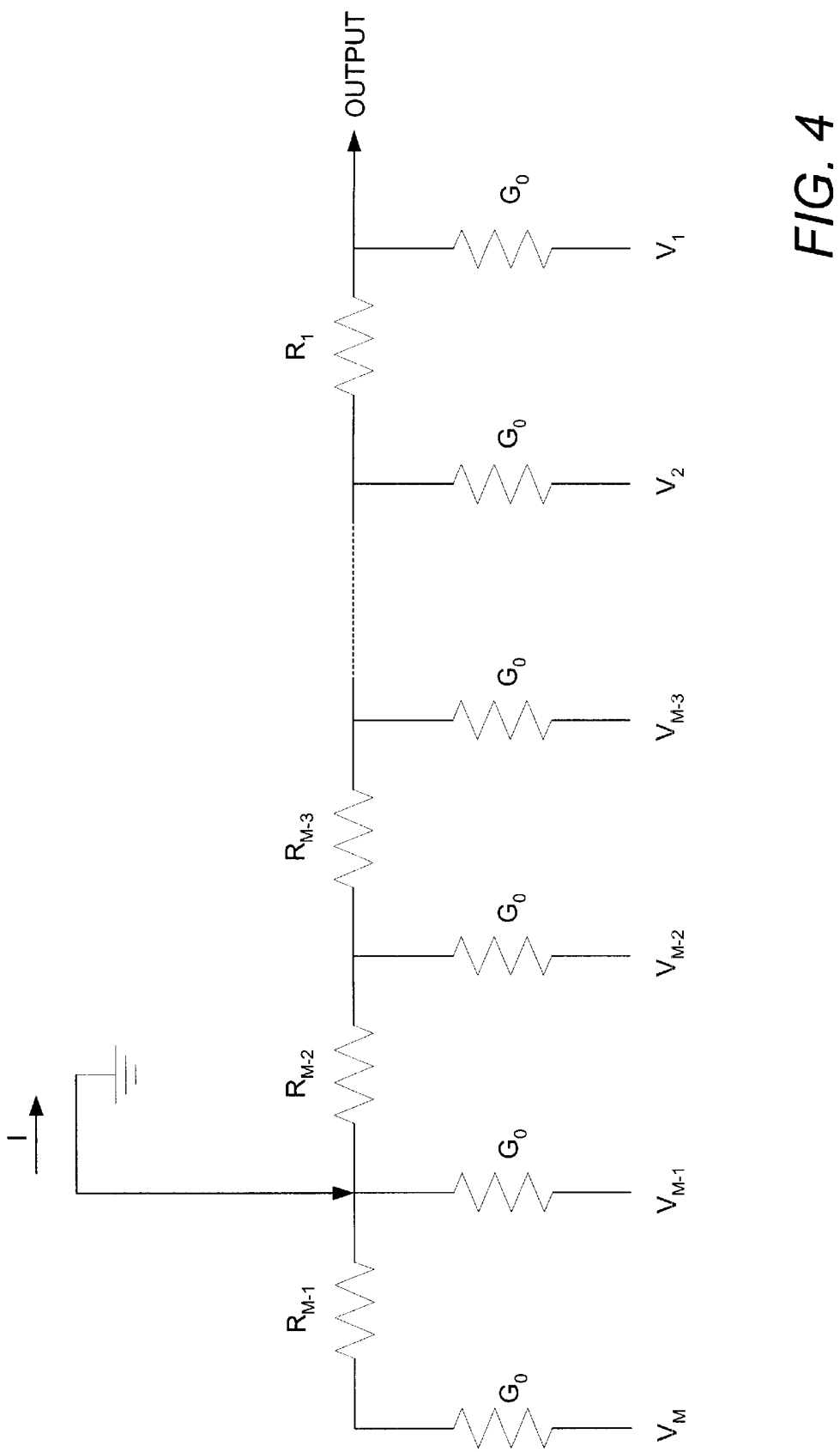
FIG. 4 is a schematic diagram of a ladder illustrating a method for computing resistor values.

FIG. 4 illustrates the method of designing ladder networks with all input conductances equal to $G_O$. Imagine a movable short-circuit, as shown connected to the right-hand side of $R_M$. The proportion of the current I flowing to ground that comes from voltage source $V_m$ and the proportion coming from $V_{M-1}$ is in the ratio of coefficients $C_M$ to $C_{M-1}$ where the coefficients $C_1$ to $C_M$ are magnitudes sorted in descending order (i.e. $C_M$ is the smallest coefficient and $C_1$ is the largest). Thus, the relationship between the input conductance $G_O$ and resistances $R_m$ is expressed as follows:

$$G_O/(1+G_O R_M): G_O = C_M : C_{M-1} \quad \text{Eq.(1)}$$

which can be rewritten as:

$$R_{m-1} = (C_{M-1}/C_M - 1)/G_0 \quad \text{Eq.(2)}$$

We now imagine moving the short-circuit one place to the right, to the right-hand side of $R_{M-1}$. The voltage sources $V_M$ and $V_{M-1}$ are also now considered to be of the same sign so that their expected contribution is in proportion to the sum of the coefficient magnitudes $C_M + C_{M-1}$. This contribution arises through the impedance of $G_O$ in parallel with $G_O$ in series with $R_M$, expressible as a new conductance value.

$$G_O' = G_O + G_O/(1 + G_O R_{M-1}) \quad \text{Eq. (3)}$$

When $R_{M-2}$ is added in series, the contribution from $V_M$ and $V_{M-1}$ will be proportional to $G_O'/(1+G_O' R_{M-2})$ while the contribution to the current I from $V_{M-2}$ is proportional to $G_O$. These should be in the ratio $(C_M + C_{M-1})$ to $C_{M-2}'$ therefore giving:

$$R_{M-2} = (1/G_O) C_{M-2}/(C_M + C_{M-1}) - (1/G_O') \quad \text{Eq. (4)}$$

We now combine $G_O'$ in series with $R_{M-2}$ and then in parallel with the $G_O$ that connects to $V_{M-2}$ to get a new value of $G_O'$, and then by similar reasoning obtain:

$$R_{M-3} = (1/G_O) C_{M-3}/(C_M + C_{M-1} + C_{M-2}) - (1/G_O') \quad \text{Eq. (5)}$$

and so forth until all values $R_i$ are determined. A final calculation of $G_O'$ gives the output conductance of the ladder.

The above calculations may be done manually for smaller ladder networks but are more practically implemented as a computer program. Using such a computer program, a set of tap weights (resistors) corresponding to a given filter design were determined for an exemplary 13-tap combined filter/converter in accordance with the present invention. The table below provides the resistive data used to construct the filter/converter 500 shown in FIG. 5.

| Tap # | Tap Logical Output | Admittance (G) mhos | Resistance (R) Ohms | Resistor Designator |
|---|---|---|---|---|
| 1 | Q | 0.0001 | 465.1 | R1 |
| 12 | Q̄ | 0.0001 | 5357.1 | R2 |
| 4 | Q̄ | 0.0001 | 774.4 | R3 |
| 11 | Q̄ | 0.0001 | 573.2 | R4 |
| 13 | Q | 0.0001 | 1134 | R5 |
| 2 | Q̄ | 0.0001 | 806.5 | R6 |
| 3 | Q | 0.0001 | 458.5 | R7 |
| 10 | Q | 0.0001 | 204.9 | R8 |
| 9 | Q̄ | 0.0001 | 94.4 | R9 |
| 5 | Q̄ | 0.0001 | 6697.4 | R10 |
| 6 | Q | 0.0001 | 1250.2 | R11 |
| 7 | Q | 0.0001 | | |

Note that the filter coefficient corresponding to Tap 8 is zero in this example and does not contribute to the output.

Figure 5:
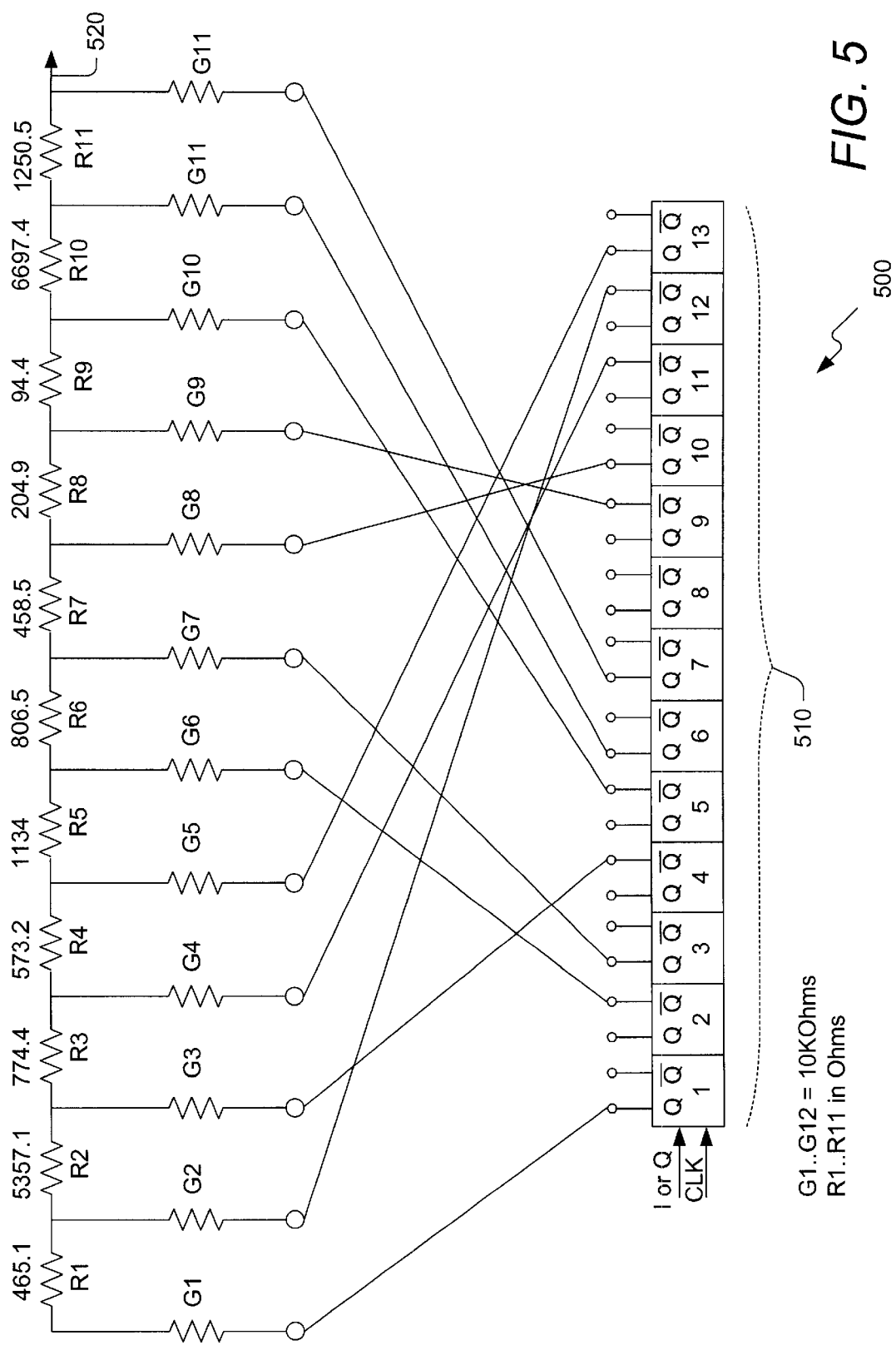
FIG. 5 a schematic diagram of an exemplary ladder network for the converter/filter of the present invention.

The combined filter/converter 500 of FIG. 5 provides 12 branch inputs 122 for 13 tap outputs, Q1/Q̄1 through Q13/Q̄13 of an associated shift register 510—Q8 is skipped because of its associated zero weighting coefficient. Note that each branch circuit 118 individually connects through an admittance G1 to G12 of 0.1 mmho (¹⁄₁₀ Kohms) to successive nodes in a series of resistors R1 to R11. The ladder network 500 provides an output connection point 520 that represents the summation of inputs Q1 through Q13 from shift register 510, with each of the Q input signals being weighted in accordance with the attenuation associated with the individual branch or stage to which it is applied. The ladder network 500 shown in FIG. 5 allows implementation of small tap weights without using large resistors, but is not optimized for minimal power consumption. Therefore there is still an interest in defining a combined filter/converter having reduced power consumption.

Figure 6:
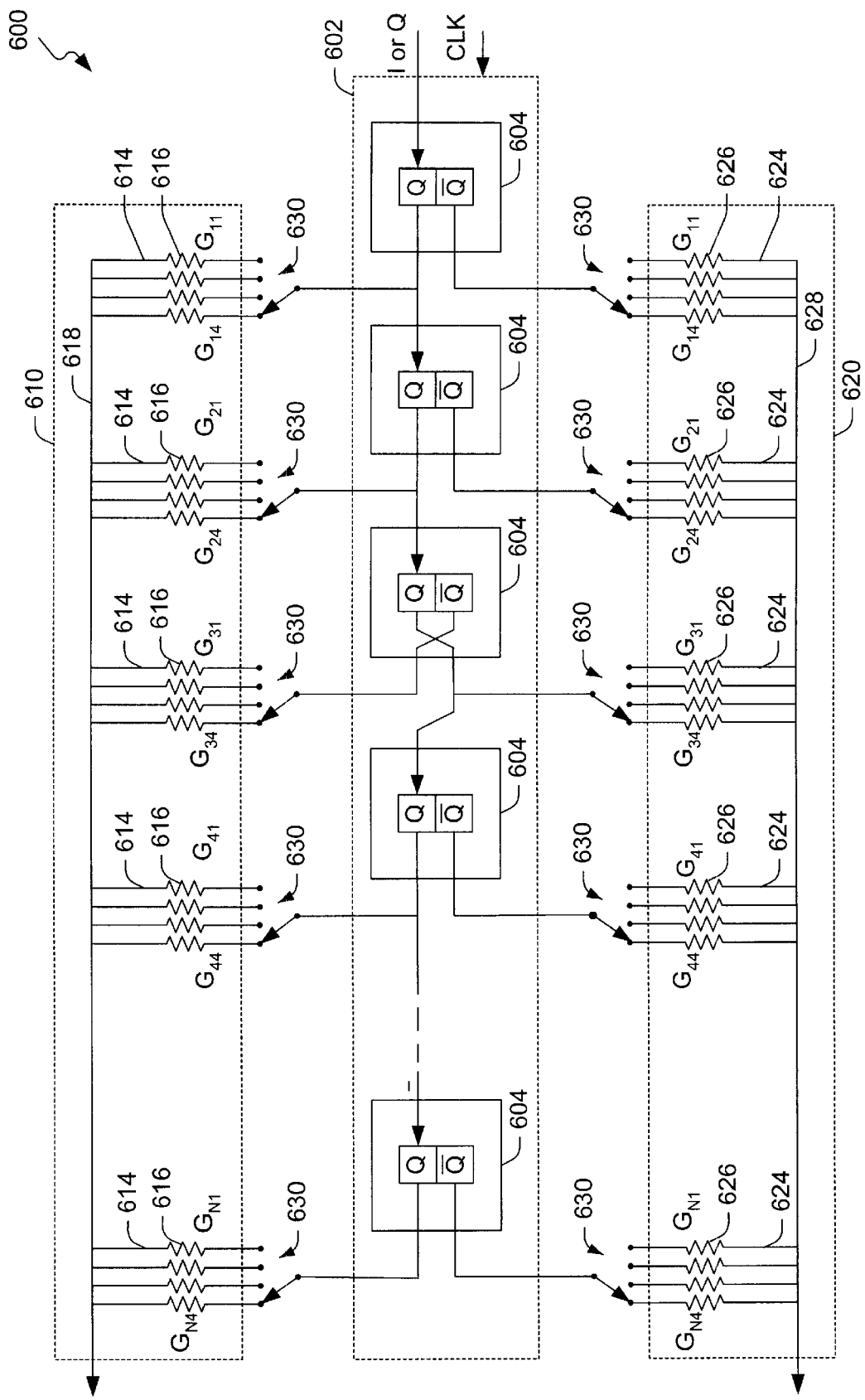
FIG. 6 is a schematic diagram of a converter/filter of the present invention using a switched resistor network.

FIG. 6 shows an alternate embodiment of the combined converter/filter of the present invention indicated generally by the numeral 600. The resistive networks 610 and 620 are not configured as ladder networks in this embodiment of the present invention. FIG. 6 assumes that the I or Q data stream input to shift register 602 comprises a series of impulses delivered in succession at the chip or bit rate of the I or Q data stream, rather than a series of square waves assumed in the earlier examples given. FIG. 6 further assumes that the shift register 602 is clocked at the chip or bit rate of the input I or Q data stream. While a square wave signal is assumed to maintain its logical value for the whole chip period, an impulse signal is active for only the first portion of each chip or bit period and has a zero value otherwise. Thus, the square wave input I or Q bit stream discussed earlier produced '111100001111000' when sampled at four times the chip or bit rate, while the waveform considered for FIG. 6 is 1000000010000000 . . .

In the earlier example, the shift register was clocked four times faster than the chip or bit rate of the incoming I or Q data. Assuming now that the earlier example's input data really comprises a series of impulses rather than square waves, the input signal (impulse) is active during only the first one of every four clock pulses. This causes the shift register of the earlier example to shift through only one meaningful bit for every four register stages, the other three stages containing non-data zero samples—the sampled impulse input is active only every fourth clock pulse. Changing from Boolean notation to arithmetic notation, the input stream in the earlier square wave example, now an impulse input, becomes '1000-10001000-1000' where a '1' represents the value of a Boolean '1', '−1' represents the value of a Boolean '0', and '0' represents non-data and has no contribution from the tap to the filter output. Therefore, when the I or Q input data is a stream of impulses delivered at the chip rate, only ¼ of the earlier illustrated shift register's taps contribute to the output signal from the ladder network at any given time. This situation is more thoroughly illustrated in the example below:

|  | Bit 1<br>1 | | | | Bit 2<br>0 | | | | Bit 3<br>1 | | | | Bit 4<br>1 | | | |
|---|---|---|---|---|---|---|---|---|---|---|---|---|---|---|---|---|
| Original I or Q<br>Boolean Input Bitstream | CK<br>1 | CK<br>2 | CK<br>3 | CK<br>4 | CK<br>5 | CK<br>6 | CK<br>7 | CK<br>8 | CK<br>9 | CK<br>10 | CK<br>11 | CK<br>12 | CK<br>13 | CK<br>14 | CK<br>15 | CK<br>16 |
| 4x Sampling Assuming Square-Wave Data | 1 | 1 | 1 | 1 | 0 | 0 | 0 | 0 | 1 | 1 | 1 | 1 | 1 | 1 | 1 | 1 |
| 4x Sampling Assuming Impulse Data | 1 | 0 | 0 | 0 | 0 | 0 | 0 | 0 | 1 | 0 | 0 | 0 | 1 | 0 | 0 | 0 |
| Arithmetic Representation | 1 | 0 | 0 | 0 | −1 | 0 | 0 | 0 | 1 | 0 | 0 | 0 | 1 | 0 | 0 | 0 |

Note: CK = clock pulse input to the serial shift register.

Thus, looking at the arithmetic representation of the last row in the table above, the shift register contents through four clock cycles (assuming four times oversampling) appear as follows:

| | SHIFT REGISTER STAGE | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| CLK 1 | 1 | 0 | 0 | 0 | −1 | 0 | 0 | 0 | 1 | 0 | 0 | 0 | 1 | 0 | 0 | 0 |
| CLK 2 | 0 | 1 | 0 | 0 | 0 | −1 | 0 | 0 | 0 | 1 | 0 | 0 | 0 | 1 | 0 | 0 |
| CLK 3 | 0 | 0 | 1 | 0 | 0 | 0 | −1 | 0 | 0 | 0 | 1 | 0 | 0 | 0 | 1 | 0 |
| CLK 4 | 0 | 0 | 0 | 1 | 0 | 0 | 0 | −1 | 0 | 0 | 0 | 1 | 0 | 0 | 0 | 1 |

Because the shift register is being clocked at four times the chip or bit rate, the clock signal may be thought of as effectively having four chip-rate clock signals, with each of the four clock signals having a successive offset of ¼ the chip period. Thus, a chip period may be said to have four phases, corresponding to the four effective chip rate clock signals. At each of these four "phases", only one quarter of the taps contributes to the output.

The converter/filter 600 of FIG. 6 takes advantage of the fact that only ¼ of the N-tap outputs from the shift register actually contribute to the ladder network output in order to reduce power consumption. FIG. 6 assumes a 52-tap filter implementation is required (N=52). In FIG. 6, the shift register is implemented with N/4 or 13 register stages, rather than 52 register stages seemingly required. This is possible because the 13 taps of shift register 602 effectively connect to a different pair of resistor networks for each of the four phases of the I or Q chip period. This is accomplished through the set of switches 630. The following explanation applies to resistor network 610 and 620. Where a reference number for resistor network 610 is given, the corresponding reference designator from resistor network 620 follows enclosed in parenthesis. Each Q and $\overline{Q}$ tap output from the shift register 602 connects to one resistor within one of four groups of resistors 616 (626). These four groups of resistors 616 (626) connect to a summing node 618 (628) through branch connections 614 (624). For each of the four phases comprising a single chip period, the 4-pole switches 630 all assume a like position and connect the Q and $\overline{Q}$ tap outputs from the shift register 602 to the summing node 618 (628) through a specific one of weighting resistors 616 (626).

This is accomplished by clocking the switches synchronous with the chip-period clock driving the shift register 602, but at four times the rate. In this manner, each of the 13 output taps from the shift register 602 has four possible weighting factors, one for each of the four chip period phases. For example, in the first group of branches (G11 through G14), the switch 630 connects to the register output tap from shift register 102 to G11 for ¼ the chip period, then to G12 for the next ¼ period, and so on through to G14. The other switches 630 associated with the other groups of branches function similarly.

Thus, the 13-tap shift register 602 of FIG. 6 realizes the functionality of a 52-tap (4 phases×13 taps=52 effective taps), but saves power versus a straightforward 52-tap implementation by only having to power ¼ the number of resistors at any one time. With the arrangement shown in FIG. 6, it may be advantageous to stagger the clock phase that controls rotation of switches 630 such that a gradual switch-over from one resistor subset to the next occurs, effectively interpolating the waveform to more than four samples per chip equivalent. This also avoids all the switching glitches occurring at the same time. The switches 630 may be implemented using transistors, and may be advantageously implemented as complementary pairs of N-channel and P-channel metal-oxide-semiconductor field-effect-transistors (MOSFETS).

Although groups of four resistors are shown connected to the same 4-pole switch 630 (i.e. all to a non-inverting Q output or all to an inverting $\overline{Q}$ output), it is likely that some coefficients will change sign in progressing through the four phases, so some of the branches 614 (624) in a particular group will be connected to non-inverting outputs of shift register 602 while other branches 614 (624) in the same group are connected to inverting outputs of shift register 602.

The polyphase solution shown in FIG. 6 can be used in conjunction with resistive ladder networks as shown in FIGS. 3 and 6. In this case, it is necessary to design four ladder networks, one for each sampling phase, but with each ladder network required to support only N/4 shift register taps. The subsets of tap weights, when divided into four phases, will not be left-right symmetrical so the ladder networks will not be symmetrical. Designing an asymmetrical ladder requires sorting all the coefficients into ascending order of absolute value, as discussed earlier. Further, the four ladder networks corresponding to the four chip or bit period phases should be designed to have the same output impedance, in case an external load is applied. This avoids the effect of an external load varying between the four phases. In a polyphase filter, the final output conductance of all four ladders should be the same. Therefore, it is necessary to scale the values in each ladder such that the final values of $G_O'$ are equal.

An exemplary embodiment of a 52-tap filter with an oversampling factor of 4 appears in Tables 1 and 2 below. The filter/converter in this example spans 13 bits or chips and is constructed in accordance with the present invention. The weights were picked from a symmetrical sin (x)/x response. The filter is implemented as a polyphase filter/converter network as in FIG. 6 but with the resistive ladder networks as illustrated in FIG. 3. Table 1 presents the filter tap coefficients corresponding to each one of the four sampling phases.

TABLE 1

SIN(X)/X COEFFICIENTS BEFORE SORTING

| PHASE 1 | PHASE 2 | PHASE 3 | PHASE 4 |
|---|---|---|---|
| −0.02294 | −0.06454 | −0.08887 | −0.08608 |
| −0.05409 | 0.00000 | 0.06106 | 0.10983 |
| 0.12836 | 0.10585 | 0.04289 | −0.04697 |
| −0.13927 | −0.20387 | −0.21233 | −0.14562 |
| 0.00000 | 0.21033 | 0.45500 | 0.69315 |
| 0.88206 | 0.98646 | 0.98646 | 0.88206 |
| 0.69315 | 0.45500 | 0.21033 | 0.00000 |
| −0.14562 | −0.21233 | −0.20387 | −0.13927 |
| −0.04697 | 0.04289 | 0.10585 | 0.12836 |
| 0.10983 | 0.06106 | 0.00000 | −0.05409 |
| −0.08608 | −0.08887 | −0.06454 | −0.02294 |
| 0.02192 | 0.05630 | 0.07073 | 0.06245 |

Table 2 presents the values for the resistive ladder network shunt and series resistors, with one set of values for each of the four sampling phases. There are four sampling phases corresponding to four ladder networks. Each ladder network employs sorted tap weights as described above. The four phases were symmetrically arranged about the sin(x)/x response, resulting in ladders 2 and 3 being identical apart from the tap connections and ladders 1 and 4 are also identical apart from the tap connections. Each of the above ladder networks must be provided twice for each filter, connected to taps of the opposite polarity, when a balanced signal output is required for a balanced modulator.

TABLE 2

VALUES FOR RESISTIVE LADDER NETWORKS 1 . . . 4

| SHUNT RES (OHMS) | TAP # OUTPUT | TAP LOGIC OUTPUT | TO NODE | THEN SERIES RES (OHMS) | TO NODE |
|---|---|---|---|---|---|
| VALUES FOR PHASE 1 LADDER | | | | | |
| 10000.0 | 13 | Q | 1 | 465.1 | 2 |
| 10000.0 | 2 | QBAR | 2 | 5357.1 | 3 |
| 10000.0 | 10 | QBAR | 3 | 774.4 | 4 |
| 10000.0 | 3 | QBAR | 4 | 573.2 | 5 |
| 10000.0 | 1 | Q | 5 | 1134.0 | 6 |
| 10000.0 | 12 | QBAR | 6 | 806.5 | 7 |
| 10000.0 | 11 | Q | 7 | 458.5 | 8 |
| 10000.0 | 4 | Q | 8 | 204.9 | 9 |
| 10000.0 | 5 | QBAR | 9 | 94.4 | 10 |
| 10000.0 | 9 | QBAR | 10 | 6697.4 | 11 |
| 10000.0 | 8 | Q | 11 | 1250.5 | 12 |
| 10000.0 | 7 | Q | 12 | — | |

TABLE 2-continued

VALUES FOR RESISTIVE LADDER NETWORKS 1 . . . 4

| SHUNT RES (OHMS) | TAP # OUTPUT | TAP LOGIC OUTPUT | TO NODE | THEN SERIES RES (OHMS) | TO NODE |
|---|---|---|---|---|---|
| VALUES FOR PHASE 2 LADDER | | | | | |
| 9560.1 | 10 | Q | 1 | 2989.6 | 2 |
| 9560.1 | 13 | Q | 2 | 459.0 | 3 |
| 9560.1 | 11 | Q | 3 | 207.4 | 4 |
| 9560.1 | 2 | QBAR | 4 | 263.2 | 5 |
| 9560.1 | 1 | Q | 5 | 586.7 | 6 |
| 9560.1 | 12 | QBAR | 6 | 422.3 | 7 |
| 9560.1 | 4 | Q | 7 | 1911.5 | 8 |
| 9560.1 | 5 | QBAR | 8 | 89.0 | 9 |
| 9560.1 | 6 | Q | 9 | 21.1 | 10 |
| 9560.1 | 9 | QBAR | 10 | 2077.3 | 11 |
| 9560.1 | 8 | Q | 11 | 3232.5 | 12 |
| 9560.1 | 7 | Q | 12 | — | |
| VALUES FOR PHASE 3 LADDER | | | | | |
| 9560.1 | 4 | Q | 1 | 2989.6 | 2 |
| 9560.1 | 1 | Q | 2 | 459.0 | 3 |
| 9560.1 | 3 | Q | 3 | 207.4 | 4 |
| 9560.1 | 12 | QBAR | 4 | 263.2 | 5 |
| 9560.1 | 13 | Q | 5 | 586.7 | 6 |
| 9560.1 | 2 | QBAR | 6 | 422.3 | 7 |
| 9560.1 | 10 | Q | 7 | 1911.5 | 8 |
| 9560.1 | 9 | QBAR | 8 | 89.0 | 9 |
| 9560.1 | 8 | Q | 9 | 21.1 | 10 |
| 9560.1 | 5 | QBAR | 10 | 2077.3 | 11 |
| 9560.1 | 6 | Q | 11 | 3232.5 | 12 |
| 9560.1 | 7 | Q | 12 | — | |
| VALUES FOR PHASE 4 LADDER | | | | | |
| 1000.0 | 1 | Q | 1 | 465.1 | 2 |
| 1000.0 | 12 | QBAR | 2 | 5357.1 | 3 |
| 1000.0 | 4 | QBAR | 3 | 774.4 | 4 |
| 1000.0 | 11 | QBAR | 4 | 573.2 | 5 |
| 1000.0 | 13 | Q | 5 | 1134.0 | 6 |
| 1000.0 | 2 | QBAR | 6 | 806.5 | 7 |
| 1000.0 | 3 | Q | 7 | 458.5 | 8 |
| 1000.0 | 10 | Q | 8 | 204.9 | 9 |
| 1000.0 | 9 | QBAR | 9 | 94.4 | 10 |
| 1000.0 | 5 | QBAR | 10 | 6697.4 | 11 |
| 1000.0 | 6 | Q | 11 | 1250.5 | 12 |
| 1000.0 | 7 | Q | 12 | — | — |

When two ladder networks for two of the phases are identical, such as for phases 2 and 3 above, an alternative to duplicating the ladder networks is to use a single ladder network, and to switch the taps to which it is connected to be the taps for phase 2, when phase 2 is selected to provide the output signal, then to be the taps for phase 3 when it is time for phase 3 to provide the output signal. Thus only two different ladder networks are needed to implement a four-phase filter operating at four samples per chip, but each must be duplicated to provide a balanced output. Thus a four-phase filter having a balanced output still requires two copies of each of two ladder networks, making four ladder networks in total. Each ladder network however comprises only one quarter the number of conductance values as described in U.S. Pat. No. 5,867,537, and so the net complexity and power consumption has been reduced by applying the new invention of sorting the tap weights into absolute magnitude order in order to use a ladder network design providing progressively greater attenuation of contribution from successive taps in sorted order.

The above-described circuits perform filtering of a continuous bitstream prior to modulating a radio signal, in order to contain the spectrum of the radio transmission within an allocated channel. Some systems employ discontinuous transmission where a transmission is started and stopped at a regular or irregular rate. TDMA systems for example transmit only in an allocated time slot that recurs regularly within a TDMA frame period. Data systems likewise may transmit short data packets and then await a reply before transmitting the next packet. There is, therefore, a need to consider the start of transmission when a first information bit is presented to the filter and modulator, no immediately prior bits being present, and similarly at the end of transmission when no bits follow the last bit. A preferred method to start a transmission is to initialize the transmit filter with zero bit values prior to inputting the first data bit, data bits being considered to have the non-zero values of +1 or −1. Thus the initial zero values successively become replaced by non-zero bit values as the first data bits are clocked in.

To represent data bit values as +1, −1 or zero, a ternary signal is required. A ternary signal can be represented by two bit-lines, one line indicating the bit magnitude of zero (0) or non-zero (1) while the other line indicates the bit sign (+or −). This can be done using two shift registers; one containing bit sign values and one containing bit magnitude values. The data stream to be transmitted is applied to the two shift registers on two bit-lines as a stream of ternary values. The data stream begins with a preamble of at least N zero values, i.e. the magnitude value on the magnitude bit-line is set to zero and the zeros are clocked into the new, magnitude shift register. The bit polarity on the bit sign-line is unimportant when the bit magnitude line is zero. The first non-zero bit to be transmitted is applied to the bit-sign line together with a '1' on the bit magnitude line. Subsequent data bits are applied to the bit sign line while holding the bit magnitude line at '1'. After the last data bit has been input, the bit magnitude line is returned to zero and held at zero for at least N bit periods to flush through the last bit of non-zero magnitude, returning the magnitude shift register to the all zeros state.

When a non-zero bit exists in a particular register position, the appropriate ladder network tap shall be connected to the non-inverted (or inverted, if tap has a negative weight) output of the sign register. When a zero bit magnitude exists in the register however, the ladder network tap shall be taken to an intermediate value between Boolean '1' and Boolean '0,' that is to a voltage of Vcc/2, where Vcc is the voltage level for a '1' and '0' is the voltage level for a '0'.

Figure 7:
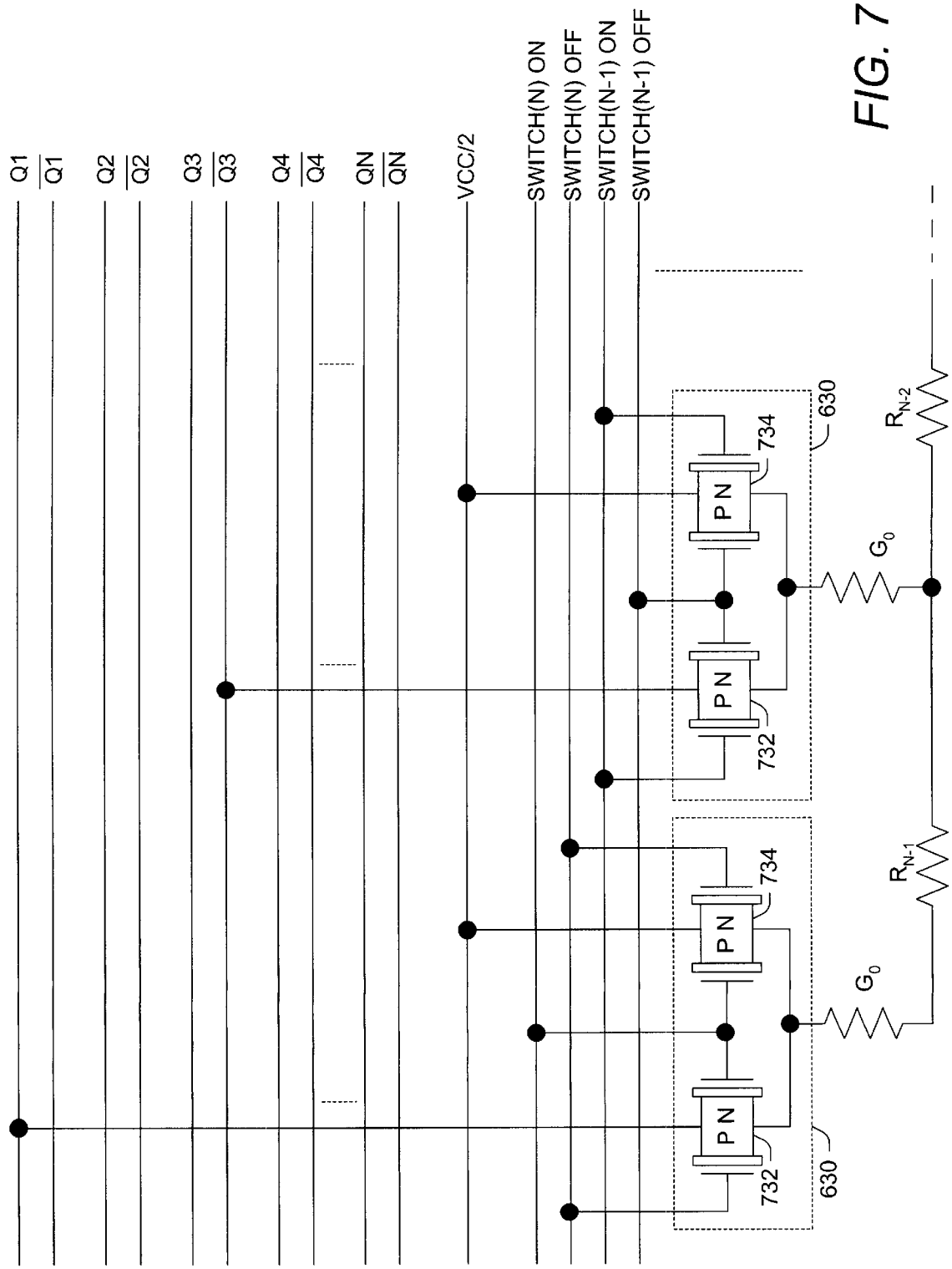
FIG. 7 is a schematic diagram of a switch used in the embodiment of FIG. 6.

FIG. 7 shows an arrangement for switches 630 for selectively connecting the ladder resistors indicated by $G_O$ either to a predetermined non-inverted or inverted output of the sign register, or alternatively to a Vcc/2 line. Each switch 630 in FIG. 7 is a two-way switch comprised of two pass-gates 732, 734, each pass-gate being formed with an N and a P FET back-to-back. A control line "Switch(n) ON" connects to the gate of the N-FET of the pass-gate 732 connected to the sign register non-inverted or inverted output for tap (n), while the inverse control line 'Switch(n) OFF' connects to the P-FET of the pass-gate 734. When "Switch(n) ON" is at a '1' level and "Switch(n) OFF" is at a "0" level, both the N and the P-FETS of this pass-gate 732 become conductive connecting the ladder resistor to Q1 in this example. The control lines are connected to the other pass-gate 734 for switch(n) in swapped order, so that the second pass-gate 734, which connects to the Vcc/2 line, is in a high impedance state at this time.

When, however, the control polarities reverse, the first pass-gate 732 turns OFF and the second pass-gate turns on to connect tap(n) to the Vcc/2 line. The latter shall occur when the magnitude register controlling tap(n) contains a zero. In a polyphase filter operating with an oversampling factor greater than 1 and having therefore several sampling phases with a pair of ladder networks associated with each phase, the pass-gates 732, 734 shall connect all taps of a ladder to Vcc/2 when that phase is deselected. Therefore the control line denoted by "Switch(n) ON" shall be formed from the logical AND of the phase-enable line and the selected bit of the magnitude register for controlling tap(n), which is in the example of FIG. 7, the magnitude bit associated with sign bit 1 (Q1).

Likewise tap(n−1) is controlled by the second two-way switch shown in FIG. 7 in a like manner, using second control signals denoted by "Switch(n−1) ON" and "Switch (n−1) OFF" which are formed by the logical AND of the phase-enable line and the magnitude register bit designated to control tap(n−1), which in the example of FIG. 7 would be magnitude register bit 3, as tap(n−1) is shown connecting to $\overline{Q(3)}$. It will be recalled from the above discussion that sign bits are not necessarily connected to like-numbered tap-resistors, but rather in an order depending on the sorting of tap weights into magnitude order. Magnitude register bits are connected to control taps using this same order of connection.

The outputs of the switched-resistor ladder network for each phase may be connected together. In a four-phase filter, three ladders of zero signal contribution then load the single ladder phase that is enabled, resulting in an attenuation of the output voltage swing by a factor of four. The peak-to-peak voltage swing of each group of four ladders is then from Vcc/2+Vcc/8 to Vcc/2−Vcc/8, a swing of Vcc/4. A second set of four ladders connected to the inverse sign-register outputs can provide an output voltage swinging in the opposite sense to form a balanced signal output of peak-to-peak swing of Vcc/2 between the two balanced outputs. The attenuated swing is more than adequate to drive typical balanced mixers so there is no need to avoid the non-enabled phases from loading the enabled phase in order to achieve a greater output signal swing.

In a balanced filter, it may also be noted that the Vcc/2 line is always connected to as many ladder taps of the inverse polarity as of the non-inverted polarity, and therefore does not itself need to supply any signal current. The Vcc/2 line does not, therefore, need to be a particularly low impedance voltage source and can be formed as a resistive tap across the supply lines. When all phases are disabled before the start and after the end of transmission, all ladder taps are connected to the Vcc/2 line that then determines the quiescent output signal voltage fed to the balanced modulator.

Figure 8:
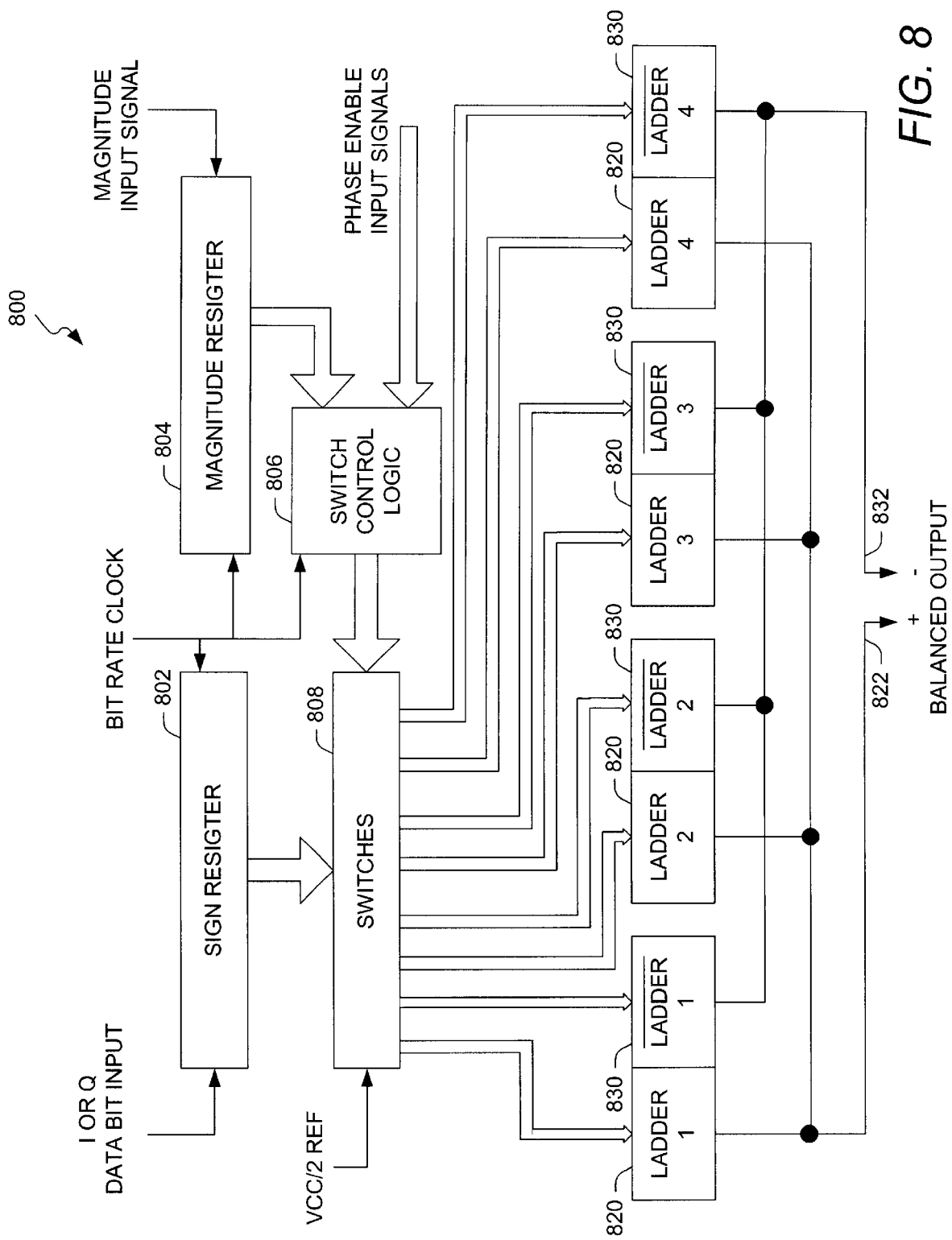
FIG. 8 is block diagram of a complete converter/filter constructed in accordance with the present invention, making use of the switch resistor network illustrated in FIG. 6.

The complete block diagram for a 4-phase combined 52-tap filter/converter including sign and magnitude registers and gates for controlling the ladder switches is shown in FIG. 8 and is generally referred to by the numeral 800. Note that the crisscrossed interconnections between the ladders 820 and 830 and the output register taps from the sign register 802 according to the aforementioned weight-magnitude sorted order have been omitted for clarity.

In general, an individual switch in switch block 808 is associated with an individual register tap in the sign register 802. In turn, the associated individual register tap in the sign register 802 has a corresponding individual register tap in the magnitude register 804. When an individual register tap in the magnitude register 804 contains a logical "0," the associated switch in switch block 808 connects a VCC/2 reference signal to an associated input in one of the ladder networks 820 or to an associated input in one of the complimentary ladder networks 830. This VCC/2 connection is independent of the contents of the corresponding register tap in the sign register 802. Thus, the contents— either a logical "0" or "1"—of an individual register tap in the sign register 802 contribute nothing to either of the balanced outputs 822 and 832 when the contents of the corresponding individual register tap in magnitude register 804 contains a logical "0."

When an individual register tap in the magnitude register 804 contains a logical "1," the associated switch in switch block 808 connects its associated register tap output from the sign register 802 to an associated input in one of the ladder networks 820 or to an associated input in one of the complimentary ladder networks 830. The associated input in the ladder networks 820 or 830 to which the register tap output is connected through the switch depends on the state of the phase enables signals input to the switch control logic 806—this is explained in more detail later. Thus, individual register taps in the magnitude register 804 individually enable corresponding individual register tap outputs in the sign register 802 to connect with an associated input in one of the ladder networks 820 or complementary ladder networks 830.

In FIG. 8, a sign register 802 receives an input data stream comprised of digital "1" and "0" values, with the sign register 802 clocked by a bit rate clock whose frequency is matched to the bit rate period of the input data stream. The sign register provides two sets of serial output taps taken from its internal register stages, one set being the logical complement of the other. As earlier described, these two sets of output taps are interconnected with a block of switches 808. In this example, the bit rate clock is multiplied by a factor of four in the switch control logic 806 to produce a switch clock synchronous with the bit rate clock but having four times the frequency—resulting in an oversampling factor M of four. This switch clock is used to clock a set of switch control signals that are output from the switch control logic 806 to the block of switches 808.

A given output tap from the sign register 802 is associated with an individual switch in the block of switches 808. Each bit rate period is divided into four successive phases by the switch clock. The sign register 802 comprises L register stages, with L determined as the number of required filter taps N divided by the oversampling factor M. Thus, in this example, the number of sign register 802 output taps L=52/4 or 13 taps—with each tap comprising a non-inverting and an inverting output. Each of the L register output taps in the sign register 802 has an associated weighting value for each of the four phases, as determined by the filter tap weighting coefficients.

By applying four sets of weighting values to the 13 output taps, the combined/filter converter has the equivalent of 52 taps (four phases per bit period times 13 taps). Each one of the four ladder networks 820 or complementary ladder networks 830 provide one of the four sets of weighting values for the sign register 802 output taps. Switch control signals output from the switch control logic 806 cause the switches in switch block 808 to synchronously switch in successive fashion through all four ladder/complimentary ladder networks on a per-phase basis, each phase time comprising ¼ of the input bit period. All switches in switch block 808 are controlled coherently, so that all switches connect their associated register tap outputs to a phase 1 weight, then to a phase 2 weight, and so on.

In summary, an individual switch in switch block 808 corresponds to a particular register tap output from the sign register 802. The individual switch selectively connects its corresponding sign register tap to each one of four associated inputs in the ladder networks 820 and 830 when the magnitude register tap corresponding to the switch's corresponding sign register contains a logic "1." In this condition, the binary combination of phase enable signals determines which of the four possible ladder network inputs the switch selectively connects to. When an individual switch's associated magnitude register tap is a "0," the switch selectively connects one of its four associated ladder network inputs to VCC/2. Again, the selective connection is made based on the phase enable signal input to the switch control logic 806.

Note that during a given phase, output 822 collectively corresponds to a given set of inverting and non-inverting register tap outputs as weighted by ladder networks 820 and complimentary ladder networks 830. Output 832 represents the complement to output 822 and therefore its signal changes will be antiphase with corresponding changes in the 822 output. This complementary behavior of output 832 with respect to output 822 is achieved by driving it with the set of register taps that are complementary to the set used to produce output 822. Of course, switch block 808 and ladder networks 820 and 830 are connected such that weighting factors applied to the complementary set of register taps are identical with those used to produce output 822.

The foregoing explanation provides detailed representations for a specific embodiment of the present invention. However, as will be readily appreciated by those skilled in the art, the present invention admits tremendous flexibility in implementation. Further, the specific realization of the present invention will depend on design requirements. Some systems will require greater or fewer register taps. Other systems may combine logical elements, illustrated separately here, into integrated systems based on sophisticated microprocessors, application-specific-circuits (ASICs), field-programmable-gate-arrays, or other such integrated logic devices. All such variations in starting design parameters and physical circuit realization are considered to be within the scope of the present invention.

What is claimed is:

1. A filter for filtering digitally quantized signal samples with a desired filtering function to provide a filtered analog signal, comprising:
   a memory device having a plurality of memory elements for holding successive digital signal samples, each memory element having at least one associated signal output;
   a plurality of combining networks, each combining network comprising a plurality of inputs corresponding to respective ones of said signal outputs and an output, wherein said outputs of said combining networks are combined to provide said filtered analog output; and
   a selection circuit for selectively connecting selected signal outputs of said memory elements to respective inputs of a selected one of said combining networks in a predetermined sequence during each of a plurality of signal sampling phases to provide said filtered analog signal at said output.

2. The filter of claim 1 wherein said memory device is a shift register.

3. The filter of claim 1 wherein said combining networks are resistive combining networks having at least one weighting resistor associated with each of said inputs, and wherein the values of said weighting resistors are chosen based on a set of weighting coefficients that determine said desired filtering function.

4. The filter of claim 3 wherein said at least one signal output includes a non-inverted output and a complementary inverted output.

5. The filter of claim 4 wherein said inputs of said combining network associated with a positive weighting coefficient are connected to one of said non-inverted outputs and wherein said inputs of said combining network associated with a negative weighting coefficient are connected to one of said inverted outputs.

6. The filter of claim 3 wherein memory elements associated with a zero weighting coefficient are not connected to said combining network.

7. The filter of claim 3 wherein each of said resistive combining networks has the same electrical output impedance.

8. The filter of claim 1 wherein said resistive combining networks are ladder networks comprising a chain of series resistors and a plurality of shunt resistors, each shunt resistor being connected at one end to said chain of series resistors and at an opposite end to an associated one of said inputs.

9. The filter of claim 8 wherein each input of each said combining network has a characteristic attenuation determined by a respective one of said weighting coefficients.

10. The filter of claim 9 wherein each of said plurality of combining networks corresponds to a subset of said set of weighting coefficients.

11. The filter of claim 10 wherein said weighting coefficients in each of said subsets are sorted in order of absolute magnitude and associated in said sorted order with consecutive ones of said inputs in said combining network.

12. The filter of claim 1 wherein said selection circuit comprises one or more switches to sequentially connect said inputs of said plurality of combining networks to said signal outputs of said memory elements during corresponding signal sampling phases.

13. The filter of claim 12 wherein said switches are CMOS bilateral switches using back-to-back P-type and N-type FETs.

14. The filter of claim 12 wherein said switches connect each of said inputs to a default electrical potential during signal sampling phases other than said corresponding signal sampling phase.

15. The filter of claim 1 wherein said at least one signal output comprises a non-inverted output and an inverted output.

16. The filter of claim 15 wherein said plurality of combining networks comprise a first plurality of combining networks, the inputs of which are sequentially connected to a first set of said inverted or non-inverted outputs, and a second, equal plurality of combining networks, the inputs of which are connected to a second complementary set of said inverted and non-inverted outputs, wherein said outputs of said first plurality of combining networks are combined at a first output and the outputs of said second plurality of combining networks are combined at a second output of said filtered signal output thereby forming a balanced filtered analog signal.

17. The filter of claim 1 wherein said digital signal samples are single-bit samples.

18. The filter of claim 1 wherein said digital signal samples are ternary signal samples representing one of the values 1, 0, or −1.

19. The filter of claim 18 wherein said ternary samples comprise two bits including a sign bit representing plus or minus and a magnitude bit representing a zero or a non-zero magnitude.

20. A filter for filtering digitally quantized signal samples with a desired filtering function to provide a filtered analog signal, comprising:

a memory device having a plurality of memory elements for holding successive digital signal samples, each memory element having at least one associated signal output;

at least one resistive ladder network comprising an output and a plurality of inputs, each of said inputs in said combining network having an associated weighting coefficient selected from a set of desired weighting coefficients that determine said desired filtering function, said inputs being arranged in sorted order based on the absolute magnitude of said associated weighting coefficients; and each of said signal outputs being connected to respective ones of said inputs based on said weighting coefficients to provide said filtered analog signal at said output.

21. The filter of claim 20 wherein said memory device is a shift register.

22. The filter of claim 20 wherein said at least one resistive ladder network comprises a plurality of ladder networks each associated with a sampling phase and with a corresponding subset of said weighting coefficients.

23. The filter of claim 22 wherein said plurality of resistiveladder networks each have the same electrical output impedance, and said wherein said outputs from said resistive ladder networks are combined to form said filtered analog signal.

24. The filter of claim 22 further comprising a switching circuit to sequentially select each of said plurality of resistive ladder networks during a corresponding sampling phase.

25. The filter of claim 24 wherein said switching circuit comprises a set of switches to connect said inputs to associated signal outputs of said memory elements during said corresponding sampling phase.

26. The filter of claim 25 wherein said switches connect said inputs to a default electrical potential during sampling phases other than said corresponding sampling phase.

27. The filter of claim 25 wherein said switches are CMOS bilateral switches using back-to-back P-type and N-type FETs.

28. The filter of claim 20 wherein said at least one signal output comprises a non-inverted output and an inverted output.

29. The filter of claim 28 wherein said at least one resistive ladder network comprises a first resistive ladder network with said inputs being connected to a first set of said inverted and non-inverted outputs of said memory elements and a second, identical ladder network with said inputs connected to a second complementary set of said inverted and non-inverted outputs of said memory elements.

30. The filter of claim 29 wherein said output of said first resistive ladder network and said output of said second resistive ladder network form a balanced output for said filtered analog signal.

31. The filter of claim 28 wherein said at least one resistive ladder network comprises a first plurality of resistive ladder networks each having inputs selectively connected to a first set of said inverted and non-inverted outputs of said memory elements and a second, equal plurality of ladder networks each having inputs selectively connected to a second complementary set of said inverted and non-inverted outputs of said memory elements, said outputs from said first plurality of ladder networks being combined at a first output and said outputs of said second plurality of ladder networks being combined at a second output to form a balanced filtered analog signal.

32. The filter of claim 31 wherein each of said first plurality of resistive ladder networks and the corresponding identical one of said second plurality of resistive ladder networks are associated with a corresponding sampling phase and with a corresponding subset of weighting coefficients.

33. The filter of claim 32 further comprising a switching circuit to select said first plurality of ladder networks and said corresponding second plurality of ladder networks in a predetermined sequence during a corresponding sampling phase to contribute to said filtered analog signal during the corresponding sampling phase.

34. The filter of claim 33 wherein said switching circuit comprises a set of switches to connect said inputs of the selected resistive ladder networks to corresponding signal outputs during said corresponding sampling phase.

35. The filter of claim 34 wherein said switches further connect said inputs to a default electrical potential during non-corresponding sampling phases.

36. The filter of claim 35 wherein said switches are CMOS bilateral switches during back-to-back P-type and N-type FETs.

37. The filter of claim 28 wherein each of said inputs is connected to a corresponding one of said non-inverted outputs of said memory elements when said associated weighting coefficient is positive, and to a corresponding one of said inverted outputs of said memory elements when said associated weighting coefficient is negative.

38. The filter of claim 20 wherein said digital signal samples are single-bit samples.

39. The filter of claim 20 wherein said digital signal samples are ternary signal samples representing one of the values 1, 0, or −1.

40. The filter of claim 39 wherein said ternary samples comprise two bits including a sign bit representing plus or minus and a magnitude bit representing a zero or a non-zero magnitude.

41. The filter of claim 40 wherein said inputs of said at least one resistive ladder network are each connected to said outputs of said memory device when said magnitude bit output is non-zero and to a default electrical potential when said magnitude bit output is zero.

42. A filter for smoothing blocks of digital signal samples with a desired filtering function prior to transmission to provide a filtered output signal, comprising:
   a memory device having a plurality of memory elements for storing successive digital samples as a sign bit representing a positive or negative signal sample sign and a magnitude bit representing a zero or a non-zero signal sample magnitude, each memory element having at least one signal output;
   at least one combining network having an output, said resistive combining network comprising a plurality of inputs connected to corresponding ones of said signal outputs of said memory elements, wherein each input is selectively connected to an associated signal output of a corresponding memory element when the associated magnitude bit is non-zero, and is connected to a default electrical potential when said magnitude bit is zero.

43. The filter of claim 42 wherein said at least one signal output includes a non-inverted output and an inverted output.

44. The filter of claim 43 wherein said at least one combining network includes a first resistive combining network selectively connected to a first set of said non-inverted and inverted outputs and a second resistive combining network selectively connected to a second set of said non-inverted and inverted outputs, said first and second resistive combining networks having a first and a second combined output forming a balanced output for said desired filtered signal output.

45. The filter of claim 42 wherein digital signal samples preceding and following said block of digital signal samples have a magnitude of zero and signal samples within said block have a non-zero magnitude, thereby effecting a smooth ramping up of the desired filtered signal output at the start of said block and a smooth ramping down of the filtered signal output at the end of said block.

46. The filter of claim 42 wherein said at least one combining network combines said digital signal samples with a plurality of combining factors determined from said desired filtering function.

47. The filter of claim 46 wherein said at least one combining network is a resistive ladder network, each input having an associated weighting coefficient selected from a set of weighting coefficients that determine said filtering function and being arranged in sorted order based on the absolute value of said associated weighting coefficients.

48. The filter of claim 42 wherein said at least one combining network comprises a plurality of resistive combining networks, said inputs of said plurality of resistive combining networks being selectively connected to associated signal outputs of said memory elements during a corresponding signal sampling phase when the associated magnitude bit is non-zero, and being selectively connected to a default potential during a non-corresponding sampling phase or when said associated magnitude bit is zero.

49. The filter of claim 48 wherein said outputs of said plurality of combining networks are combined to form the desired filtered output signal.

50. The filter of claim 47 including a plurality of ladder networks, wherein said input of each said resistive ladder network is selectively connected to said signal output of a corresponding memory element during a corresponding signal sampling phase when the associated magnitude bit is non-zero, and to a default potential when the associated magnitude bit is zero.

51. The filter of claim 50 wherein each of said resistive ladder networks have the same output impedance.

52. The filter of claim 43 wherein said at least one resistive combining network combines said digital signal samples using a plurality of combining factors given by a set of weighting coefficients that determine said desired filtering function to provide said filtered analog signal.

53. The filter of claim 52 wherein said inputs of said at least one resistive combining network having positive associated weighting coefficient are selectively connected to said non-inverted outputs of said memory elements and inputs having a negative associated weighting coefficient are selectively connected to inverted outputs of said memory elements.

54. The filter of claim 53 wherein said at least one resistive combining ladder network comprises a first ladder network having inputs connected to a first set of said non-inverted and inverted outputs of said memory elements, and a second ladder network having inputs connected to a second set of said non-inverted and inverted outputs of said memory elements.

55. The filter of claim 50 wherein each said input is connected to a default potential during sampling phases other than said corresponding sampling phase.

56. The filter of claim 51 wherein each said ladder network provides said desired filtered output signal during a corresponding sampling phase.

57. A method of filtering digital signal samples with a desired filtering function to provide a filtered analog signal, said method comprising:
   serially inputting, during a plurality of successive signal sampling phases, successive digital signal samples into a memory device having a plurality of memory elements, each memory element having at least one signal output;

connecting said signal outputs of said memory elements to a selected one of a plurality of combining networks during each of said successive signal sampling phases, each of said combining networks providing an output during a corresponding signal sampling phase; and combining said outputs of said combining networks during said successive signal sampling intervals to provide said filtered analog signal.

58. The method of claim 57 wherein said combining networks are resistive networks having a plurality of inputs, each input having an associated weighting resistor, wherein the values of said weighting resistors are selected based a set of weighting coefficients that determine said desired filtering function.

59. The method of claim 58 wherein said at least one signal output includes a non-inverted output and a complementary inverted output.

60. The method of claim 59 wherein said inputs of said resistive networks associated with a positive weighting coefficient are connected to one of said non-inverted outputs and wherein said inputs of said combining network associated with a negative weighting coefficient are connected to one of said inverted sign outputs.

61. The method of claim 57 wherein said resistive combining networks are resistive ladder networks comprising a chain of series resistors and a plurality of shunt resistors, each shunt resistor being connected at one end to said chain of series resistors and at an opposite end to an associated one of said plurality of inputs.

62. The method of claim 61 wherein said series and shunt resistors provide a plurality of attenuation factors each corresponding to a weighting coefficient selected from a set of weighting coefficients that determine said desired filtering function.

63. The method of claim 57 wherein each of said plurality of combining networks corresponds to a subset of said set of weighting coefficients.

64. The method of claim 63 wherein said weighting coefficients in each of said subsets are sorted in order of absolute magnitude and associated in said sorted order with consecutive ones of said inputs in said combining network.

65. The method of claim 57 wherein said at least one signal output comprises a non-inverted output and an inverted output.

66. The method of claim 65 wherein said plurality of combining networks comprise a first plurality of combining networks having a plurality of inputs connected to a first set of said inverted or non-inverted outputs, and a second, equal plurality of combining networks having inputs connected to a second set of said inverted or non-inverted outputs, wherein the outputs of said first plurality of combining networks are combined at a first output and the outputs of said second plurality of combining networks are combined at a second output thereby forming a balanced signal output.

67. A method of filtering digital signal samples, each sample represented by a sign bit and a magnitude bit, with a desired filtering function to provide a filtered analog signal, said method comprising:

serially inputting a magnitude bit stream comprising a plurality of said magnitude bits into a magnitude register having a plurality of memory elements;

serially inputting a corresponding sign bit stream comprising a plurality of said sign bits into a sign register having a plurality of memory elements;

connecting said memory elements in said sign register to respective inputs of at least one combining network when a corresponding bit in said magnitude bit register is non-zero; and combining signals present at said inputs of said combining network to provide said filtered analog signal at an output of said combining network.

68. The method of claim 67 wherein said memory elements in said sign register include an inverted and a non-inverted output, and wherein said step of connecting said memory elements in said sign register to said at least one combining network comprises selectively connecting a first set of said inverted and non-inverted outputs to inputs of a first combining network and selectively connecting a second complementary set of said inverted and non-inverted outputs to inputs of a second combining network to form a balanced output for said filtered analog signal.

69. The method of claim 67 wherein said step of combining said signals present at said inputs of said combining network comprises weighting said signals present at said inputs with a set of weighting coefficients that determine said desired filtering function.

70. The method of claim 69 wherein said combining network comprises a resistive ladder network having a plurality of inputs, each input having an attenuation corresponding to an associated one of said weighting coefficients.

71. The method of claim 70 wherein said inputs of said resistive ladder network are arranged in sorted order based on absolute values of said associated weighting coefficients.

72. The method of claim 67 wherein said at least one combining network comprises a plurality of combining networks, each corresponding to one of a plurality of signal sampling phases, and wherein said step of connecting said memory elements in said sign register to said at least one combining network comprises sequentially connecting said plurality of signal outputs of said memory elements to a corresponding one of said combining networks during each of said signal sampling phases.

73. The method of claim 72 wherein said memory elements in said sign register include an inverted and a non-inverted output, and wherein said step of connecting said memory elements in said sign register to said at least one combining network further comprises connecting a first set of said inverted and non-inverted outputs to inputs of a first combining network and connecting a second complementary set of said inverted and non-inverted outputs to inputs of a second combining network to form a balanced output for said filtered analog signal.

74. A method of filtering digital signal samples with a desired filtering function to provide a filtered analog signal, said method comprising:

inputting successive digital signal samples into a serial memory device having a plurality of memory elements, each memory element having at least one output signal associated with one of a set of weighting coefficients determined by said desired filtering function;

connecting selected ones of said output signals of said memory elements to respective inputs of at least one combining network, each one of said inputs having an attenuation with respect to a common output corresponding to one of said set of weighting coefficients, said inputs arranged in order based on the absolute magnitude of said corresponding weighting coefficients;

combining said plurality of output signals in said combining network to produce said filtered analog signal at said common output.

75. The method of claim 74 wherein said at least one combining network comprises a plurality of combining networks corresponding to a plurality of digital signal sampling phases and wherein said connecting step further comprises selectively connecting selected output signals of said memory elements to a corresponding one of said plurality of combining networks during each of said digital signal sampling phases.

76. The method of claim 75 wherein said at least one output signal from each said memory element in said memory device includes an inverted and non-inverted output signal, and wherein said connecting step further comprises connecting a first set of said inverted and non-inverted output signals to a first combining network and connecting a second complementary set of said inverted and non-inverted output signals to a second combining network to form a balanced output for said filtered analog signal.

77. The method of claim 74 wherein said at least one output signal from each said memory element in said memory device includes an inverted and non-inverted output signal, and wherein said connecting step further comprises connecting a first set of said inverted and non-inverted output signals to a first combining network and connecting a second complementary set of said inverted and non-inverted output signals to a second combining network to form a balanced output for said filtered analog signal.

78. A combined digital-to-analog conversion and filtering circuit to convert a digital signal into an analog signal filtered according to a desired filter function comprising:

a resistive ladder network comprising a plurality of weighted tap inputs coupled to a combined signal output through a network of weighting resistors determined from tap coefficients of a desired digital filter, and wherein the weighted tap inputs are ordered according to tap coefficient magnitude; and a digital shift register to successively shift samples of the digital signal through a plurality of successive stages, each stage including at least one digital output, and wherein the digital outputs from one or more stages are coupled to the corresponding ones of the weighted tap inputs of the resistive ladder network in accordance with the desired filter function.

79. A method of simultaneously filtering and converting a digital signal to an analog signal comprising:

defining a plurality of weighting factors, or tap coefficients, in accordance with a desired filter function;

defining a plurality of weighting resistors, corresponding to the plurality of weighting factors, within a resistive ladder network with a plurality of weighted tap inputs and a combined signal output;

coupling digital outputs from one or more stages in a digital shift register to the corresponding plurality of weighted tap inputs of the resistive ladder network in accordance with the desired filter function; and shifting successive digital signal samples through the digital shift register, such that a filtered analog signal is formed at the combined signal output of the resistive ladder network.

* * * * *